(12) United States Patent
Roesner et al.

(10) Patent No.: US 9,930,802 B2
(45) Date of Patent: Mar. 27, 2018

(54) HOUSING AND HINGE TO ENABLE BOARD MOVEMENT

(71) Applicant: Hewlett Packard Enterprise Development LP, Houston, TX (US)

(72) Inventors: Arlen L Roesner, Fort Collins, CO (US); Dave Mayer, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/223,045

(22) Filed: Jul. 29, 2016

(65) Prior Publication Data

US 2018/0035562 A1    Feb. 1, 2018

(51) Int. Cl.
*G06F 1/18*    (2006.01)
*H05K 7/14*    (2006.01)

(52) U.S. Cl.
CPC ........... *H05K 7/1487* (2013.01); *G06F 1/183* (2013.01)

(58) Field of Classification Search
CPC ........... H05K 7/1452; H05K 7/141454; H05K 7/1474; H05K 7/1487–7/1489; H05K 7/16; G06F 1/183–1/186
See application file for complete search history.

(56) References Cited

U.S. PATENT DOCUMENTS

| | | | | |
|---|---|---|---|---|
| 4,303,285 | A * | 12/1981 | Wiegers | B65F 1/06 232/43.1 |
| 6,791,843 | B1 * | 9/2004 | Dobbs | H01R 13/62933 361/740 |
| 6,896,539 | B2 * | 5/2005 | Dobbs | H05K 1/144 361/802 |
| 7,145,780 | B2 * | 12/2006 | Malone | H05K 7/1421 361/752 |
| 2007/0017174 | A1 * | 1/2007 | Lavell | E04F 19/04 52/267 |
| 2007/0281500 | A1 * | 12/2007 | Wang | H01R 12/721 439/62 |
| 2012/0164884 | A1 * | 6/2012 | Hetzer | H01R 13/719 439/620.22 |

* cited by examiner

*Primary Examiner* — Hoa C Nguyen
(74) *Attorney, Agent, or Firm* — Brooks, Cameron & Huebsch, PLLC

(57) ABSTRACT

An example device in accordance with an aspect of the present disclosure includes a housing to guide the device for attachment onto a computing system. A board is mounted in the housing and includes a first connector facing along a first direction. A hinge is to enable at least a portion of the board and the first connector to move along the first direction and engage a second connector for installation.

15 Claims, 7 Drawing Sheets

HOUSING AND HINGE TO ENABLE BOARD MOVEMENT

BACKGROUND

A system can be serviced by disconnecting and removing a system board from its chassis. This can involve increased disassembly time, and increased chances of damage due to handling and electrostatic discharge (ESD). Furthermore, disengagement of the board's retention features to allow interconnects to be unmated introduces the possibility of an administrator forgetting to reengage the retention features, and imposes increased assembly and/or disassembly time. Systems, such as blades, can be interconnected by cables to help avoid needing to disengage connectors when system boards are moved. However, cable interconnects involve increased cost, a need for additional space, and a reduction in signal integrity.

BRIEF DESCRIPTION OF THE DRAWINGS/FIGURES

DETAILED DESCRIPTION

A computing system, such as a bladed server, can be made more flexible by interconnecting two or more individual server blades together, and installing the joined blades into a blade enclosure/chassis. This interconnect typically includes both a mechanical and an electrical interconnect between connectors of the blades/expanders. To access the lower bladed server (e.g., to add memory, upgrade processors, etc.), the upper bladed server (e.g., an expansion blade) can be removed. It is advantageous for the removal operation to be streamlined, to minimize the time involved and handling required. Along these lines, examples described herein enable two boards (e.g., a board from the example device, and a board from a computing system) to be connected electrically through mezzanine style connectors. The connectors can be engaged/disengaged with minimal disassembly and handling, by use of a hinge to allow the connectors to separate. Thus, it is possible to gain access to previously inaccessible areas of the device/system, without needing the user to disassemble the device's board completely from its chassis/housing. This saves time and reduces the chances of misassembly. Example implementations can support tool-less servicing, allowing the board to remain in place while the electrical interconnect is mated/unmated. Accordingly, a multi-direction type of chassis mechanical attach (such as using an L-shaped slot to receive a top cover based on two different movements/directions, i.e., drop-and-slide mechanical attach) can be used with electrical interconnects that engage and disengage along a single-direction.

Figure 1:
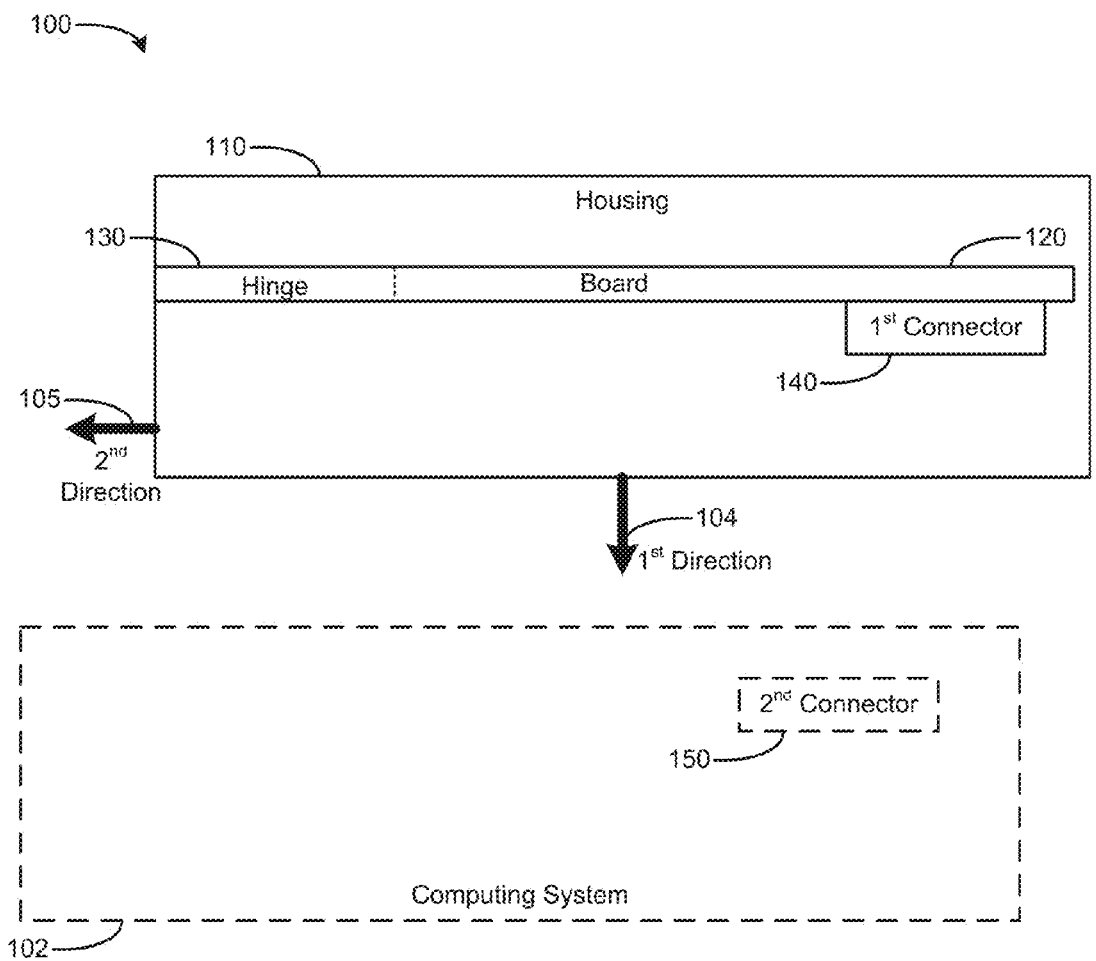
FIG. 1 is a block diagram of a device including a board and a hinge according to an example.

FIG. 1 is a block diagram of a device 100 including a board 120 and a hinge 130 according to an example. The board 120 includes a first connector 140 disposed on the board, facing along the first direction 104. The device 100 is to be coupled to the computing system 102 so that the first connector 140 can interface with a second connector 150 of the computing system 102, based on movement of the housing along the first direction 104 and the second direction 105.

The housing 110 can include mechanical features to guide the device 100 for attachment onto the computing system 102. For example, the housing 110 can include posts that slide into corresponding slots of the computing system 102 (see, e.g., slots 203 shown in FIG. 2). The housing 110 can thereby interface with the computing system 102 based on moving the housing 110 in a first direction 104 toward the computing system 102, and then by moving the housing 110 in a second direction 105 substantially non-parallel to the first direction 104. However, such movement can pose a challenge for electrical interconnects, such as risking the first connector 140 colliding with, or otherwise failing to clear, the second connector 150 during the dual-movement for mechanical interconnection of the device 100 and computing system 102. Accordingly, example implementations enable the board 120 to be mounted in the housing 110 by hinge 130. Thus, the first connector 140 disposed on the board 120 facing along the first direction 104 is able to clear the second connector 150, when the housing 110 is moved along the second direction 105. In the example implementations described herein, the first connector 140 and the second connector 150 are matable by engaging along the first direction 104.

More specifically, regarding engagement between first and second connectors 140, 150, the hinge 130 enables at least a portion of the board 120 and the first connector 140 to move, relative to the housing 110, along the first direction 104. For example, the board 120 can be fixed to the housing 110 at a first end of the board 120 at the hinge 130 using, e.g., fasteners such as screws, allowing a second end of the board 120 at the first connector 140 to flex up and down along the first direction 104. Such an example enables the hinge 130 to be provided by at least a portion of the board 120 that flexes and serves as a living hinge. In alternate examples, the board can be fastened to the housing 110 using a hinge fastener, such that the board 120 can pivot about the hinge fastener without flexing. With the first end of the board 120 pivotally mounted to the housing 110 via the hinge 130, a pivoting movement of the first end is enabled, resulting in movement of a second end of the board 120 along the first direction 104. A combination of hinge fastener and board flexing also can be used. By moving the board 120 upward along the first direction 104, the first connector 140 can clear the second connector 150, such that the first connector 140 and second connector 150 can safely pass by each other when moving the device 110 along the second direction 105 relative to the computing system 102. Movement along the second direction 105 aligns the housing 110 and computing system 102, and the first connector 140 and second connector 150. This enables the first connector 140 to engage the second connector 150 based on engagement along the first direction 104, e.g., by unflexing and/or pivoting the hinge 130 and/or board 120 to allow the connector end of the board 120 to pivot about the hinge 130.

Figure 2A:
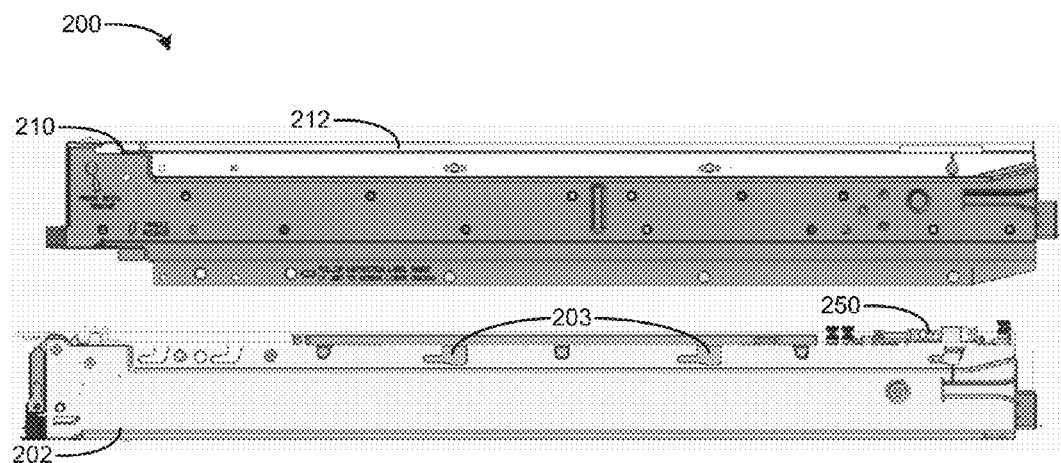
FIGS. 2A and 2B are side views of a device including a housing according to an example.

FIG. 2A is a side view of a device 200 including a housing 210 according to an example. The housing 210 of the device 200 is shown with a top cover 212 installed. The computing system 202 is shown including slots 203, to receive the device 200 along first and second directions. The second connector 250 is visible along a top of the computing system 202. FIG. 2A shows the device 200 prior to installation, offset relative the computing device along the first and second directions.

The example device 200 is shown as an expander, to interface with a blade connector (second connector 250) of computing system 202, which is shown as a blade. The expander device 200 can be dropped vertically onto the blade computing system 202, and slid forward to lock into place, similar to how a top cover 212 can be installed onto the top of an expander or blade. The expander/device 210, in turn, can receive the top cover 212. The top cover 212 can also provide structural/mechanical support to the device 210, which can include providing support downward onto components mounted inside the device 210, e.g., holding components into place against a floor of the housing 210.

Figure 2B:
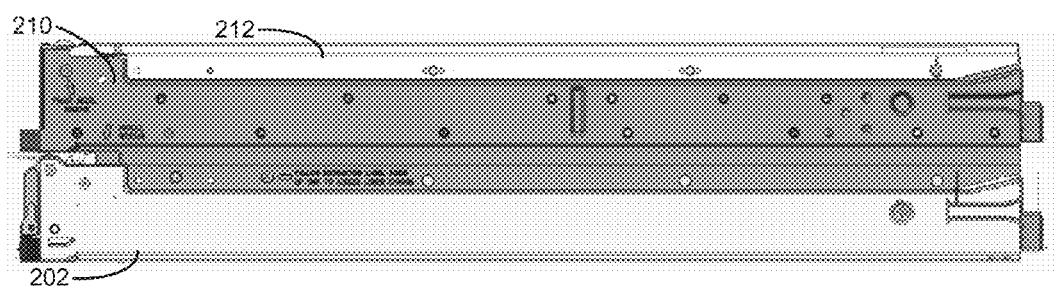

FIG. 2B is a side view of the device of FIG. 2B, illustrating the housing 210 engaged with the computing system 202 and aligned along the second direction. This illustrates how the housing 210 can interface with the computing system 202 in a similar manner to the top cover 212, with the top cover 212 interfaced with a top of the housing 210 as though it were interfacing with a computing system 202.

Figure 3A:
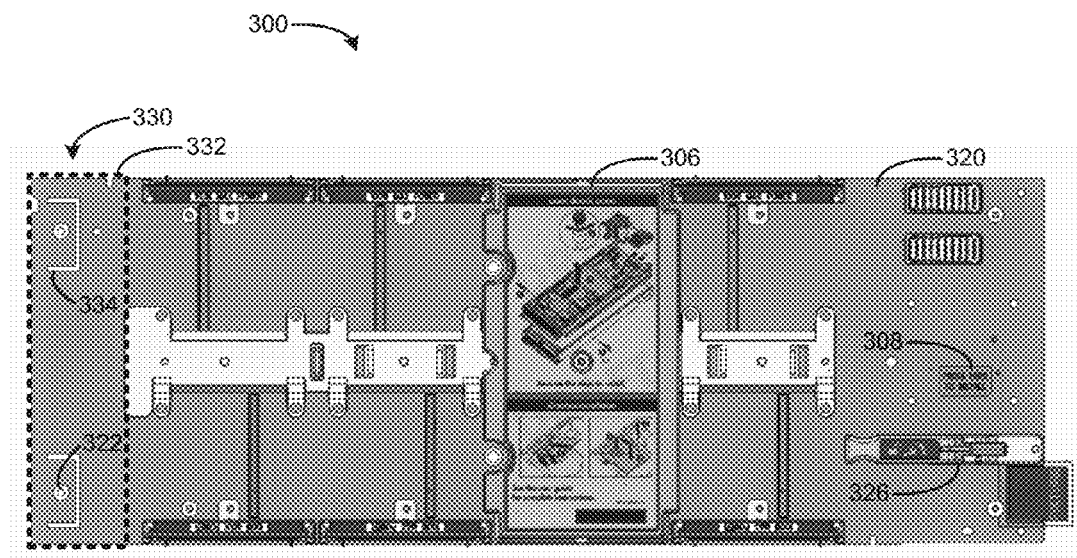
FIG. 3A is a top view of a device including a board and a hinge according to an example.

FIG. 3A is a top view of a device 300 including a board 320 and a hinge 330 according to an example. The hinge 330 is associated with a component keepout region 332, and illustrates some example cutout regions 334, and example fasteners 322 to fasten the board 320 to a floor of a housing (not shown in FIG. 3A). The board 320 includes a lever 326, associated with engaging and/or disengaging the first connector 340 (see FIG. 3B) of the board 320 with a corresponding second connector of a computing system (not shown in FIG. 3A, see, e.g., second connector 250 of FIG. 2A). Because the board 320 includes some assembled components mounted on it, the board 320 also can be referred to as a printed circuit assembly (PCA).

The fasteners 322 are shown as screws, to secure a first end/front of the board 320 to a housing. Various other types of fasteners 322 can be used, such as thumb screws, rivets, and the like. In alternate examples, the fasteners 332 can be located elsewhere at the hinge 330, e.g., on edges of the board 320 to hingedly mount the board 320 to the housing.

The component keepout region 330 of the board 320 is associated with providing a living hinge. Thus, the component keepout region 332 can be used to prevent components, such as a ball grid array chip, from being placed on a location of the board 320 that would negatively affect the component due to flexing of the board 320.

The one or more cutout regions 334 can be formed in the living hinge 330 to affect characteristics of the living hinge 330. A cutout region 334 can be formed partially around a corresponding fastener 322, to alter the characteristic of the living hinge 330 and direct flexing toward regions of the board 320 near the fasteners 322. In alternate examples, the cutout regions 334 can be curved, joined to each other, or provided in alternate configurations to affect the living hinge 330. For example, a cutout region 334 can be formed as a slits extending in a region between the fasteners 322.

A component 306 is shown disposed approximately midway between first and second ends of the board 320. The illustrated component 306 is a middle air blocker, which extends along a first direction away from the board 320 and can come in contact with a top cover to be installed over the board 320. Thus, the component 306 can serve as a structural component between an upper surface of the board 320, and a lower surface of the top cover (not shown in FIG. 3A). Support from the top cover that is secured in place, can transfer to the board 320 via the component 306, thereby enabling the corresponding middle section of the board 320 to be secured in a tool-less manner against a floor of the housing, without the use of fasteners. Similarly, other components can be located on the board 320 e.g., toward rear and/or front portions of the board 320, to support those corresponding portions of the board 320 by virtue of using the top cover to structurally sandwich components and the board 320 between a floor of the housing and the top cover. In alternate examples, the board can be selectively fastened to the housing, e.g., using removable thumb screws or other fasteners. Such fasteners can also secure components or other structures to the board 320, such as mezzanine brackets to support other expansion cards that can interface with other connectors on an upper surface of the board 320. The component 306 is shown disposed over a center/spine support extending down the board 320 to reinforce board stiffness and prevent flexing. The support is shown disposed outside the component keepout region 332, to avoid interfering with flexibility of living hinge 330.

The lever 326 is shown hingedly mounted to an upper surface of the board 320, to allow user interaction to lift or lower the lever 326. A label 308 is also depicted in FIG. 3A. The lever 326 can include detents to provide tactile feedback and enable the lever to be held in a desired position (opened and/or closed). The lever 326 can be spring-loaded, biased toward a given desired position. A portion of the lever 326 can extend through a plane of the board 320, to interact with portions of the device below the board 320 as set forth in greater detail below.

Figure 3B:
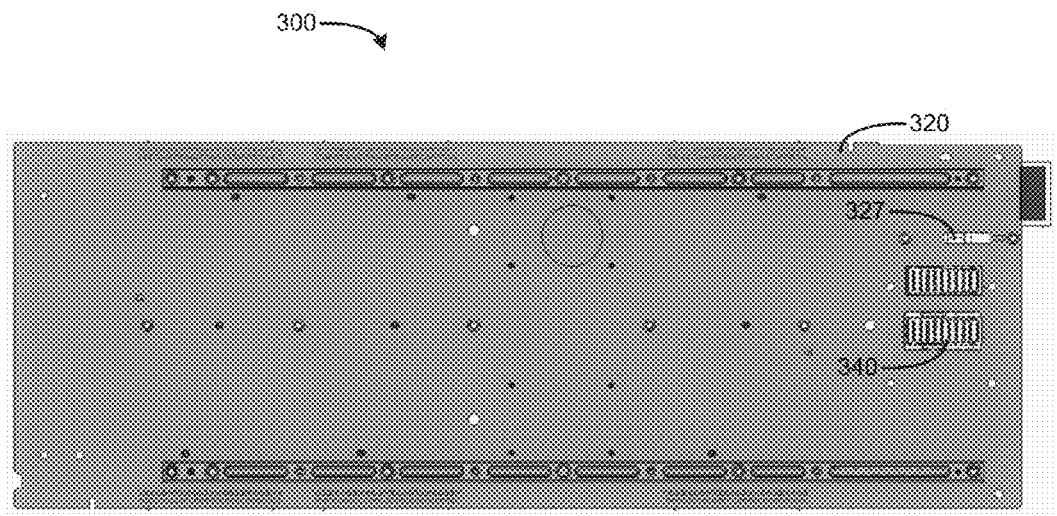
FIG. 3B is a bottom view of the device of FIG. 3A including a board and a first connector according to an example.

FIG. 3B is a bottom view of the device 300 of FIG. 3A including a board 320 and a first connector 340 according to an example. The lever 326 includes a toe 327, which can protrude through the board 320.

The connector 340 is located nearly midway between side edges of the board 320, and is offset from the toe 327 of the lever 326. The label 308 of FIG. 3A corresponds to a location of the connector 340. Accordingly, an engagement force can be applied to the label 308, which is then transmitted directly to the connector 340. This application of force can avoid introducing a lateral torque to the board that might be a result of application of force offset from the connector 340. In alternate examples, the lever 326 (and corresponding toe 327) can be provided in a manner to balance a force/forces introduced to the connector 340. For example, the lever 326 can include dual toes 327 mechanically coupled to the lever 326 and arranged on either side of the connector 340 in a balanced arrangement. In alternate example implementations including multiple connectors 340, the lever 326 and toe 327 can be arranged midway between the connectors 340, to balance the engagement and/or disengagement forces that would be applied to the connectors, without introducing a substantially unbalanced lateral torque to a given connector and/or the board 320. In alternate embodiments, multiple levers 326/toes 327 can be provided.

The board 320 is shown with two outer supports along edges of the board 320. Similar to the center support shown in the top view of FIG. 3A, the outer supports help stiffen the board 320, to prevent flexing of the board in sections other than those corresponding to the component keepout region 332, and can help counter the effects of twists/torque that the board 320 might experience when engaging/disengaging connectors.

Figure 4A:
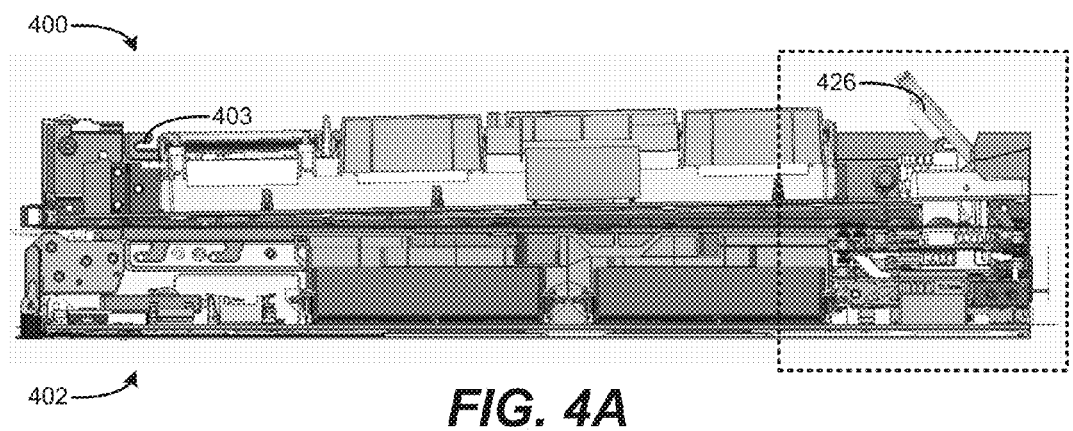
FIG. 4A is a side view of a device including a lever in an open position according to an example.
Figure 4B:
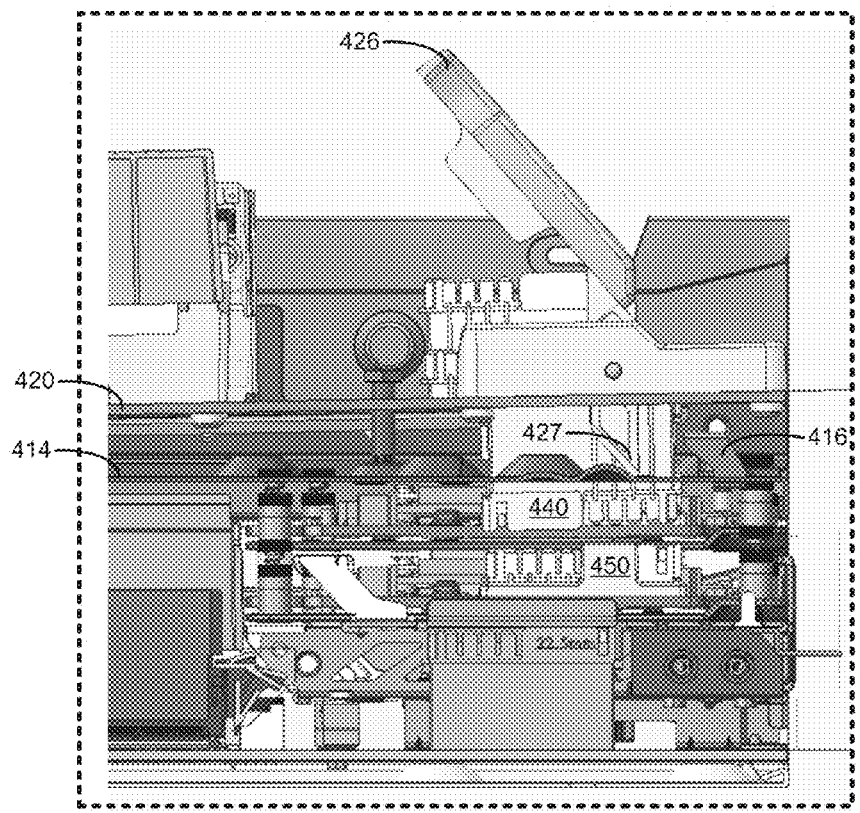
FIG. 4B is a side view detail of the device of FIG. 4A.

FIG. 4A is a side view of a device 400 including a lever 426 in an open position according to an example, and FIG. 4B is a side view detail of the device 400 of FIG. 4A. The first connector 440 of the device 400 and the second connector 450 of the computing system 402 are shown disengaged to pass by each other, by virtue of the board 420 being flexed away from the floor 414 of the housing of the device 400 (for example, the rear of the board 420 is shown flexed upward by an angle of approximately one degree). A latch 416 is shown hingedly coupled to the floor 414, to enable a toe 427 of the lever 426 to pass through the board 420 and engage the latch 416 when the lever 426 is moved from the illustrated open position to a closed position (see FIGS. 4C and 4D). A slot 403 is visible on a top of the device 400, to receive a top cover (not shown in FIG. 4, see FIG. 2). A sidewall of the housing is not shown in FIG. 4A, for better visibility of the components and board enclosed within the housing.

The lever 426 includes an open position and a closed position. In the open position, the toe 427 of the lever 426 can push against the floor 414 of the housing to move the board 420 away from the floor 414 (and cause the first connector 440 to move away from the second connector 450) along the first direction. In the closed position, the toe 427 can pull against the latch 416 mounted to the floor 414, to move the board 420 and first connector 440 toward the floor 414 and second connector 450, respectively, along the first direction. Such movements at the rear/connector end of the board 420 can occur while the opposite/front end of the board 420 is secured in place by fasteners into the floor 414 of the housing, by virtue of flexing of the board 420.

The lever/toe/latch interaction can provide forces to engage and/or disengage the first and second connectors 440, 450. As shown in the example arrangement of FIGS. 3A and 3B, the lever/toe/latch can be offset to a side of the connectors 440, 450, but alternate examples can provide such components so that they are centered or arranged on two sides to provide a centered force. As shown in FIG. 3A, the board 320 can include the label 308, to identify where a user can press to engage the connectors 440, 450. As shown, the location of the label 308 on the upper surface of the board 320 corresponds to a location of the interface 340 on the lower surface of the board 320. The label 308 can be arranged where space on the board 320 would otherwise be occupied by pins of the connector 440, thereby making use of space that would otherwise go unused. The various components can be laid out to avoid signal routing that may be present in the board 320.

When the connectors 440, 450 are engaged, the second end of the board 420 near the connectors 440, 450 can be secured against the floor 414 in a tool-less manner, without the use of fasteners, as set forth above regarding using support by the top cover to sandwich a component and the board 420 between the floor 414 and the top cover, to prevent the component and board 420 from moving away from the floor 414 of the housing. In alternate examples, the board 320 can be secured using fasteners, such as quick-release thumb screws, posts, and the like.

Figure 4C:
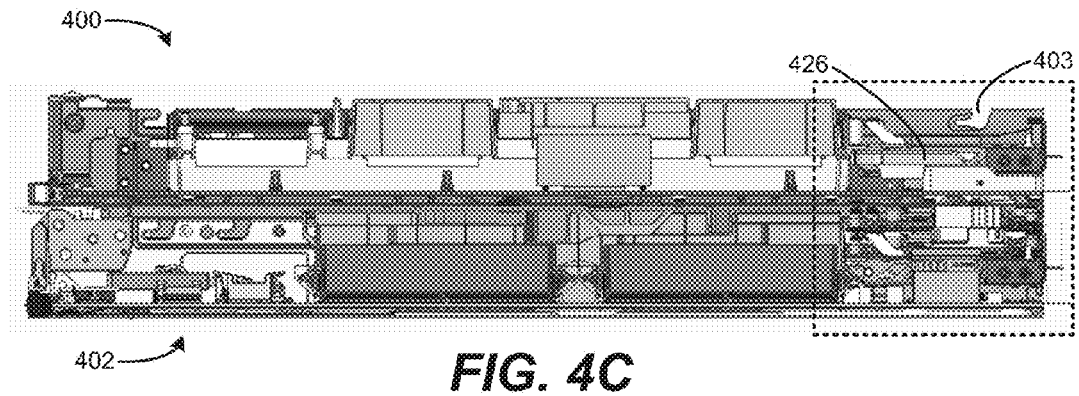
FIG. 4C is a side view of a device including a lever in a closed position according to an example.
Figure 4D:
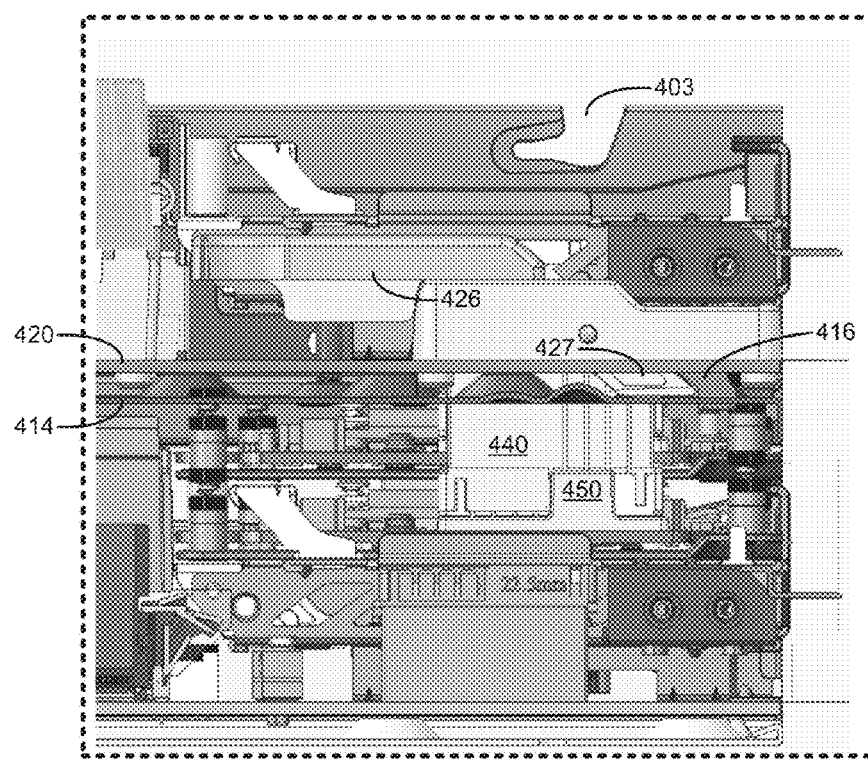
FIG. 4D is a side view detail of the device of FIG. 4C.

FIG. 4C is a side view of a device 400 including a lever 426 in a closed position according to an example, and FIG. 4D is a side view detail of the device 400 of FIG. 4C. The first connector 440 of the device 400 and the second connector 450 of the computing system 402 are shown engaged, such that the board 420 is unflexed and aligned with the floor 414 of the housing of the device 400. The toe 427 of the lever 426 is engaged with the latch 416 due to the lever 426 being in the closed position. A slot 403 is visible on a top of the device 400, to receive a top cover (not shown in FIG. 4, see FIG. 2).

Figure 5A:
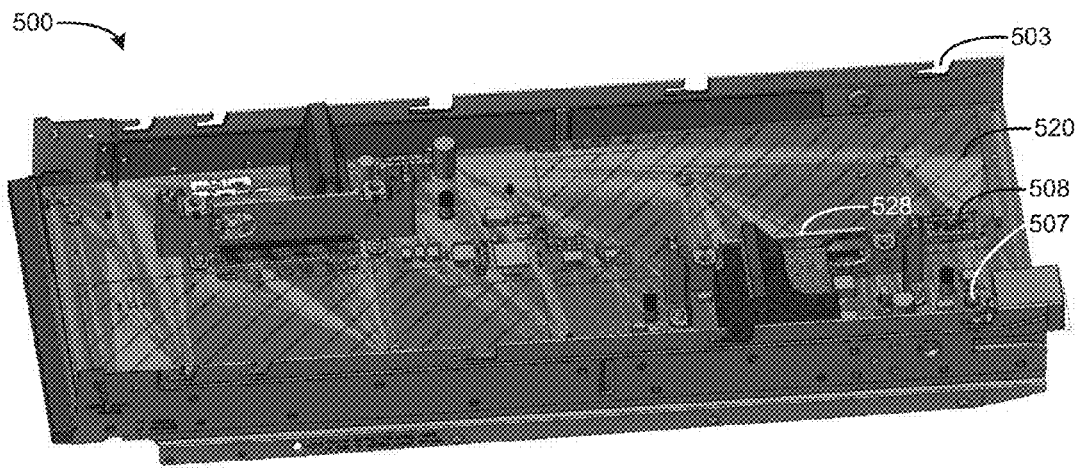
FIG. 5A is a top perspective view of a device including a handle according to an example.
Figure 5B:
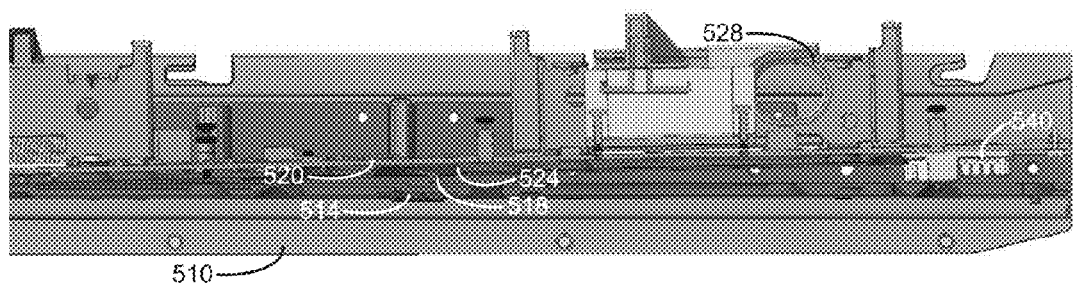
FIG. 5B is a side view of the device of FIG. 5A.

FIG. 5A is a top perspective view of a device 500 including a handle 528 according to an example. The handle 528 is fixed to the board 520 of the device 500. Various slots 503 are visible, to receive a top cover (not shown in FIG. 5A). FIG. 5B is a side view of the device 500 of FIG. 5A. The board 520 is shown flexed upward at an end of the board near the first connector 540, away from the floor 514 of the housing 510, such that the first connector 540 is disengaged and positioned away from the housing floor 514. The spring 518 is shown applying a bias between the board 520 and the floor 514, to bias the board 520 away from the floor 514 to support the weight of the board 520, such that the first connector 540 of the device 500 is ready for installation even if a user does not interact with the handle 528.

The handle 528 is mounted to the board 520 to enable the board 520 and the first connector 540 to be moved along the first direction. A hole is shown to serve as a finger/hand grip. In alternate example implementations, other types of grips may be used to facilitate user interaction for manually raising and lowering the board 520. Label 508 is shown in FIG. 5A, which enables manually pressing on a top surface of the board 520, to apply force without introducing a lateral torque (e.g., directly where the first connector 540 is located). In an example usage scenario, the handle 528 can be used for raising the board 520 to disengage the connectors and allow the spring 518 to hold up the board 520 while the device 500 is mounted to a computing system. Once slid into place (based on two movements along non-parallel directions), the label 508 can be pressed to lower the board 520 to engage the aligned connectors.

A stopper bolt 507 is shown in FIG. 5A. The stopper bolt 507 allows for movement of the board 520 up and down, but acts as a stop to prevent excessive board movement upward, downward, or both upward and downward. In an example implementation, the stopper bolt 507 is secured to a floor of the housing 510, and permits the rear end of the board 520 to rise a distance corresponding to approximately 1.3 degrees of rotational flex of the board 520.

At least one spring 518 is disposed between a floor 514 of the housing and the board 520. The spring 518 is to apply a bias to the board 520 along the first direction, and to support the board when the first connector 540 is disengaged from a second connector. The spring 518 is held captive between the board 520 and the floor 514. The spring 518 enables the board 518, and associated board components, to remain raised after the handle 528 has been manipulated by a user, allowing installation or removal without risk of interference between first and second connectors. The spring 518 is compressed when the connectors are mated. In alternate example implementations, multiple springs 518 can be used. For example, a pair of springs 518 can be used to distribute and/or balance forces, such that less stress is experienced at each spring (compared to using a single, thicker spring), and such that a lateral torque is not introduced to the board 520. The spring 518 is shown in contact with a receiver 524, formed as a recess in a reinforcing backer plate attached to an underside of the board 520.

Figure 6:
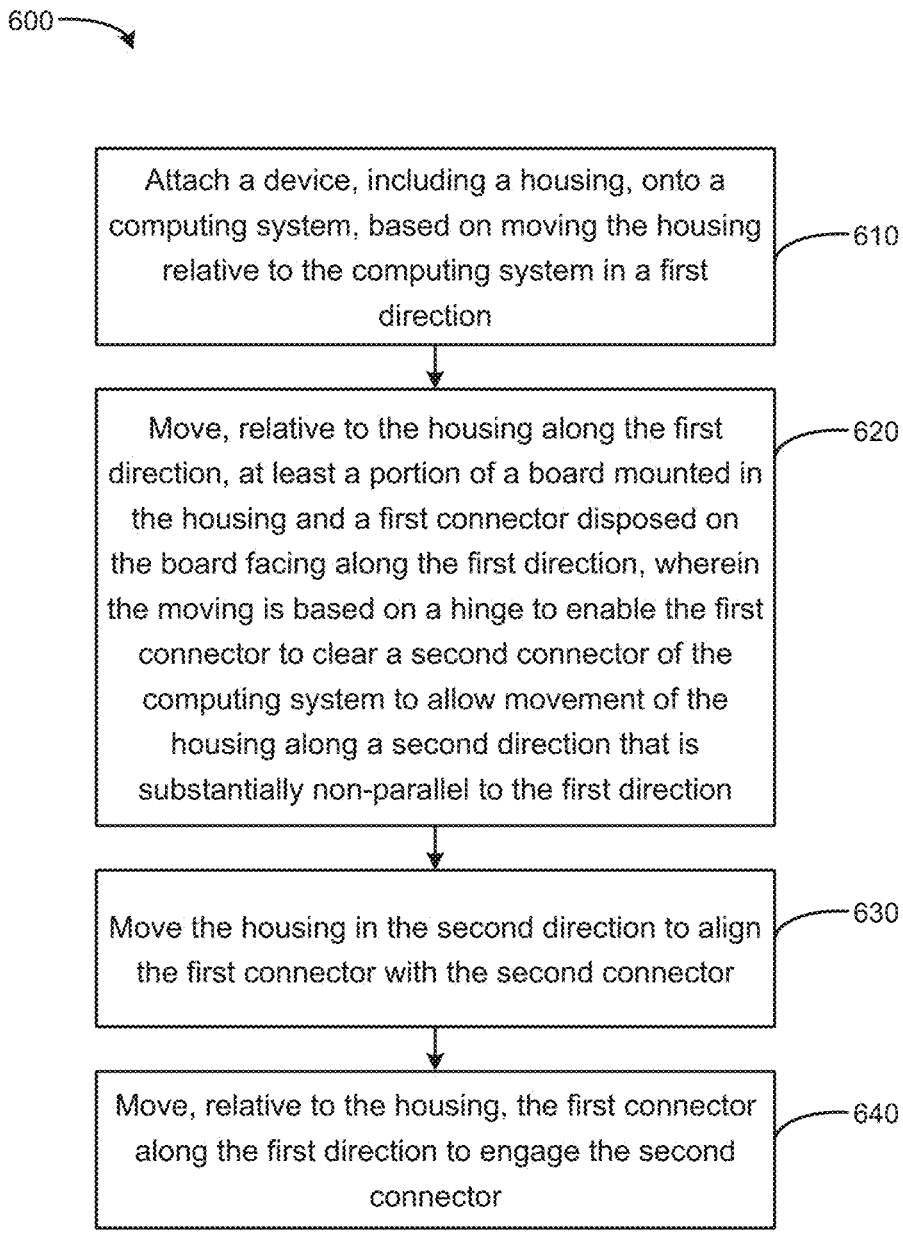
FIG. 6 is a flow chart based on engaging first and second connectors according to an example.

Referring to FIG. 6, a flow diagram is illustrated in accordance with various examples of the present disclosure.

The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 6 is a flow chart 600 based on engaging first and second connectors according to an example. In block 610, a device, including a housing, is attached onto a computing system, based on moving the housing relative to the computing system in a first direction. For example, an expander chassis/housing can be dropped into slots of a blade computing system, and slid forward to mechanically lock the expander and blade together. In block 620, at least a portion of a board mounted in the housing, and a first connector disposed on the board facing along the first direction, is moved relative to the housing along the first direction. The moving is based on a hinge to enable the first connector to clear a second connector of the computing system to allow movement of the housing along a second direction that is substantially non-parallel to the first direction. For example, a lever can be moved to an open position, to cause the lever to flex at least a portion of the expander's board away from an underlying connector on the blade, providing clearance between the connectors to enable the expander device to be slid forward for mechanical locking. In block 630, the housing is moved in the second direction to align the first connector with the second connector. For example, the device and its housing is slid forward, such that leading edges of the first and second connectors slide past each other until the full extent of the connectors is aligned and ready for engagement. In block 640, the first connector is moved, relative to the housing, along the first direction to engage the second connector. For example, the lever can be moved to a closed position, allowing the board to unflex and move its first connector toward a second connector of the underlying blade computing system. A label on the board also can be pushed, to apply engagement force directly to the back of the first connector to avoid introducing lateral torque.

What is claimed is:

1. A device comprising:
   a housing to guide the device for attachment onto a computing system, based on moving the housing relative to the computing system in a first direction, and moving the housing in a second direction substantially non-parallel to the first direction;
   a board mounted in the housing, including a first connector disposed on the board facing along the first direction; and
   a hinge formed by at least a portion of the board to enable at least a portion of the board and the first connector to move, relative to the housing, along the first direction to clear a second connector when moving the housing along the second direction, and to enable the first connector to engage the second connector for installation based on engagement between the first connector and the second connector along the first direction.

2. The device of claim 1, wherein a first end of the board is fixedly mounted to the housing, and wherein the hinge is to serve as a living hinge and flex to allow movement of a second end of the board along the second direction.

3. The device of claim 2, further comprising a component keepout region of the board associated with providing the living hinge.

4. The device of claim 2, further comprising at least one cutout region formed in the living hinge to affect characteristics of the living hinge.

5. The device of claim 1, wherein a first end of the board is pivotally mounted to the housing via the hinge, to allow pivoting movement of the first end, and movement of a second end of the board along the first direction.

6. The device of claim 1, further comprising a lever having an open position and a closed position, wherein the lever has a toe that, in the open position, is to push against a floor of the housing to move the board and first connector away from the floor and second connector along the first direction, and wherein the toe, in the closed position, is to pull against a latch of the floor to move the board and first connector toward the floor and second connector along the first direction.

7. The device of claim 1, further comprising at least one spring disposed between a floor of the housing and the board, to apply a bias to the board along the first direction, and to support the board when the first connector is disengaged from the second connector.

8. The device of claim 1, further comprising a handle mounted to the board to enable the board and first connector to be moved along the first direction.

9. The device of claim 1, wherein the device is an expander that is installable on a blade of a computing server in place of a top cover for the blade, and wherein the expander is to receive the top cover.

10. A device comprising:
    a housing to guide the device for attachment onto a computing system, based on moving the housing relative to the computing system in a first direction, and moving the housing in a second direction substantially non-parallel to the first direction;
    a board including a first connector disposed on the board facing along the first direction, wherein a first end of the board is fixedly mounted to the housing; and
    a hinge formed by at least a portion of the board that is to flex to allow movement of a second end of the board along the second direction to enable at least a portion of the board and the first connector to move, relative to the housing, along the first direction to clear a second connector when moving the housing along the second direction, and to enable the first connector to engage the second connector for installation based on engagement between the first connector and the second connector along the first direction.

11. The device of claim 10, wherein the housing is to interface with a top of a blade of a computing system at an interface to receive a top cover, and a top of the housing is to receive the top cover.

12. The device of claim 11, wherein the housing includes a floor, and the second end of the board is secured against the floor in a tool-less manner without the use of fasteners, based on the top cover contacting a component disposed between the board and the top cover, to prevent the component and board from moving away from the floor of the housing.

13. The device of claim 10, wherein the first connector and the second connector are blade expander interconnects.

14. A method, comprising:
    attaching a device, including a housing, onto a computing system, based on moving the housing relative to the computing system in a first direction;
    moving based on a hinge formed by at least a portion of a board, relative to the housing along the first direction, at least a portion of the board mounted in the housing and a first connector disposed on the board facing along the first direction, wherein the moving based on the hinge to enable the first connector to clear a second connector of the computing system to allow movement of the housing along a second direction that is substantially non-parallel to the first direction;

moving the housing in the second direction to align the first connector with the second connector; and moving, relative to the housing, the first connector along the first direction to engage the second connector.

15. The method of claim 14, wherein moving the first connector relative to the housing along the first direction is based on a lever disposed on the board and movable between an open position and a closed position.

* * * * *